United States Patent
Waki et al.

(10) Patent No.: US 8,861,715 B2
(45) Date of Patent: Oct. 14, 2014

(54) ELECTRONIC DEVICE

(71) Applicant: JVC Kenwood Corporation, Yokohama (JP)

(72) Inventors: Michio Waki, Yokohama (JP); Jin Kimura, Yokohama (JP); Satoshi Yoshimura, Yokohama (JP)

(73) Assignee: JVC Kenwood Corporation, Yokohama-shi, Kanagawa (JP)

( * ) Notice: Subject to any disclaimer, the term of this patent is extended or adjusted under 35 U.S.C. 154(b) by 0 days.

(21) Appl. No.: 14/073,468

(22) Filed: Nov. 6, 2013

(65) Prior Publication Data
US 2014/0055933 A1 Feb. 27, 2014

Related U.S. Application Data

(63) Continuation of application No. PCT/JP2012/061565, filed on May 1, 2012.

(30) Foreign Application Priority Data

May 11, 2011 (JP) ................................ 2011-106061

(51) Int. Cl.
H04M 1/00 (2006.01)
H05K 7/10 (2006.01)
H04M 1/725 (2006.01)
H04M 1/04 (2006.01)

(52) U.S. Cl.
CPC ............. *H05K 7/10* (2013.01); *H04M 1/72527* (2013.01); *H04M 1/04* (2013.01)
USPC .......................... 379/455; 379/441; 455/575.1

(58) Field of Classification Search
USPC ............... 379/441, 446, 454, 455; 455/556.1, 455/575.1; 361/679.41, 679.55, 679.56
See application file for complete search history.

(56) References Cited

U.S. PATENT DOCUMENTS

| | | | |
|---|---|---|---|
| 6,591,085 B1 * | 7/2003 | Grady | 455/42 |
| 7,230,822 B2 * | 6/2007 | Langberg et al. | 361/679.23 |
| 8,145,821 B2 * | 3/2012 | Mead et al. | 710/303 |
| 2005/0255895 A1 * | 11/2005 | Lee et al. | 455/573 |

FOREIGN PATENT DOCUMENTS

| | | |
|---|---|---|
| JP | 2000-115315 A | 4/2000 |
| JP | 2007-523433 A | 8/2007 |
| JP | 4917701 B1 | 2/2012 |

* cited by examiner

Primary Examiner — Tuan D Nguyen
(74) Attorney, Agent, or Firm — Nath, Goldberg & Meyer; Jerald L. Meyer; Stanley N. Protigal

(57) ABSTRACT

An electronic device includes a housing having an open portion at a part of a surface thereof, a door portion having at the open portion, a first face and a second face to be selectively exposed by rotation thereof, and a cradle having a connector and provided on the first face. The cradle is rotatable between a first attitude and a second attitude around a rotation axis line perpendicularly intersecting the first face.

6 Claims, 10 Drawing Sheets

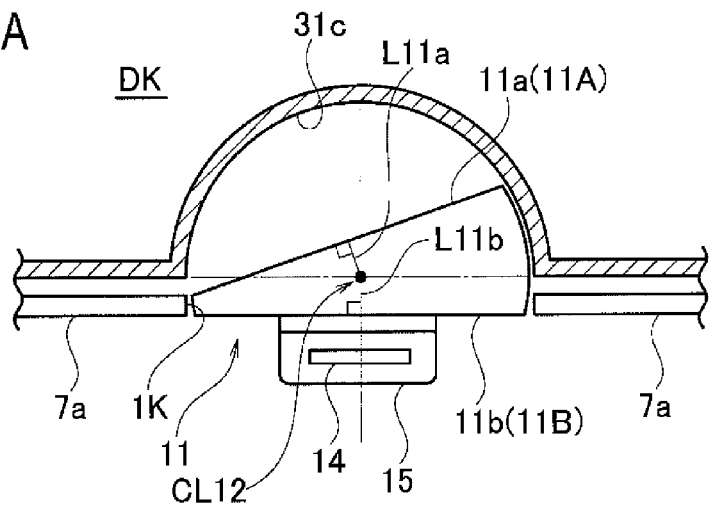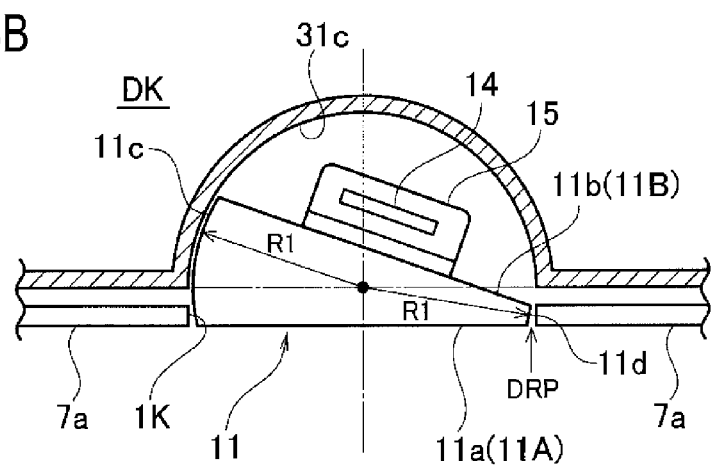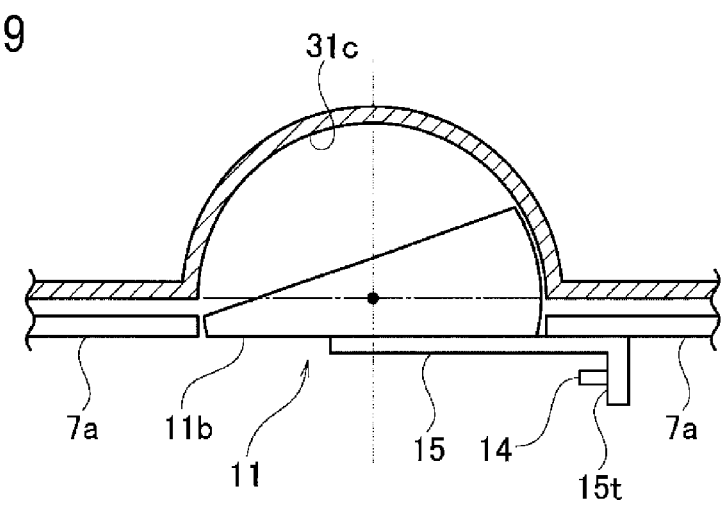

[ARROW Y1]

ELECTRONIC DEVICE

CROSS REFERENCE TO RELATED APPLICATION

This is a continuation application based on PCT application No. PCT/JP2012/061565 filed on May 1, 2012, which claims the benefit of priority from Japanese Patent Application No. 2011-106061 filed on May 11, 2011, the entire contents of which are incorporated by reference herein.

BACKGROUND

The present invention relates to an electronic device, and especially relates to an electronic device to which a mobile terminal device can be attached.

Mobile terminal devices that reproduce sound or image are becoming common. As such mobile terminal devices, there are small products for mainly reproducing music (for example, a portable music player having about 100 mm length and about 40 mm width), products having a communication function and having a display device with a diagonal line about 4 inch (for example, a cellular phone called a smartphone) and tablet-type products having a display device with a diagonal line about 10 inch. Each of the above mobile terminal devices has a terminal portion for externally transmitting and receiving sound or image signals.

Concerning an output sound, the mobile terminal device is so configured that the user listens to such output sound mainly by a head phone, without a speaker or with a small speaker if provided. Concerning an output image, enlargement of the image size is limited due to a high regard for portability. Thus, for meeting the user's request for listening to the reproduced sound at high volume or with high quality or for enjoying images by a large screen, electronic devices each of which is provided with a cradle are sold, wherein the cradle has a connector structure connectable with the above terminal portion and is capable of hold the mobile terminal device. An example of such electronic devices is described in Patent Literature 1 (Japanese Unexamined Patent Application Publication (Translation of PCT Application) No. 2007-523433).

In a conventional electronic device, even if it has a state where a mobile terminal device is not attached, a connector for connecting the electronic device to the mobile terminal device and a shape for attaching the mobile terminal device formed around the connector, are always exposed. Due to this, there are problems that occurrence of interference of connection at the time when unexpected extra external force is applied to the connector is concerned, and it is difficult to maintain appearance quality of the electronic device at the high level.

SUMMARY

In view of the above-described problems, an object of the present invention is to provide an electronic device in which there is no possibility that external force is applied to a connector in a state where a mobile terminal device is not attached thereto, and appearance quality thereof is maintained at the high level.

In order to solve the above problem, according to an aspect of the present invention, there is provided an electronic device including: a housing having an open portion at a part of a surface thereof; a door portion having a first face and a second face to be selectively exposed at the open portion by rotation thereof around a predetermined rotation axis line; and a cradle having a connector and provided on the first face.

According to the electronic device, there is no possibility that external force is applied to a connector in a state where a mobile terminal device is not attached thereto, and appearance quality thereof is maintained at the high level.

BRIEF DESCRIPTION OF THE DRAWINGS

FIG. 8A is a pattern diagram for explaining about the rotation of the essential portions of the electronic device according to the embodiment of the present invention.

FIG. 8B is a pattern diagram for explaining about the rotation of the essential portions of the electronic device according to the embodiment of the present invention.

FIG. 9 is another pattern diagram for explaining the essential portions of the electronic device according to the embodiment of the present invention.

DETAILED DESCRIPTION

An embodiment of the present invention will be described by referring to FIG. 1 to FIG. 11B.

An electronic device according to the embodiment of the present invention is a control unit 50 which is provided with a connector for connecting a mobile terminal device, and a mobile terminal is connectable to the connector. An audio system for mobile terminal includes the control unit 50 and a pair of right and left speaker systems (not shown). The electronic device is sold as the control unit 50 alone or as the audio system for mobile terminal.

Figure 1:
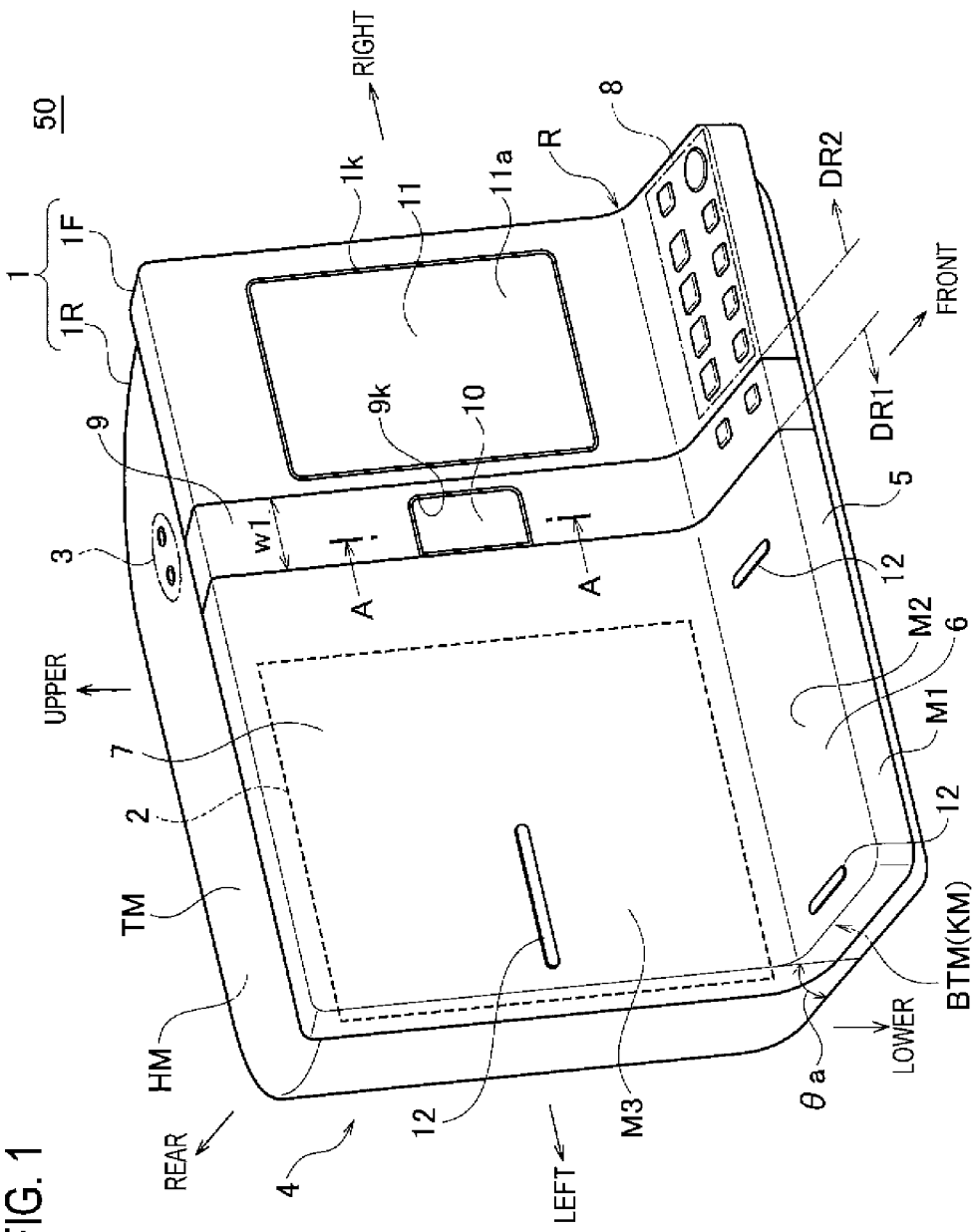
FIG. 1 is an external perspective view showing a basic state of an electronic device according to an embodiment of the present invention.

FIG. 1 shows a basic state of the control unit 50. In FIG. 1, front side, rear side, left side, right side, upper side and lower side of the control unit 50 are defined by respectively indicated sides. The control unit 50 can be mainly divided into two states, that is, a basic state where the mobile terminal device cannot be attached to the control unit 50 and a connection state where the mobile terminal device can be attached to the control unit 50 (details to be described afterward).

In FIG. 1, the control unit 50 includes a housing 1 which is a combination of a front cover 1F and a rear cover 1R and has a substantially L-shape when viewed from the left side, and a circuit portion 2 which is equipped with a signal processing circuit and the like and is received in the housing 1. An upper face TM of the housing 1 is provided with an upper terminal portion 3 having terminals of an external input and a headphone output. A rear face HM (rear side of plane of paper of FIG. 1) of the housing 1 is provided with a rear terminal portion 4 (only the reference number is shown) including output terminals of a speaker (including sub-woofer) output and an image output, input terminals of a DC power source input and an antenna input, and other terminals such as USB terminal.

The front side of the housing 1 generally includes three portions. Specifically, the three portions include a front portion 5 having a face M1 connected to a bottom face BTM as a base face KM and substantially perpendicularly rising from the bottom face BTM, a shelf portion 6 having a face M2 extending substantially in parallel with the bottom face BTM toward the rear face HM, and a dock portion 7 connected to the face M2 and having a face M3 rising toward the upper face TM. The face M2 and the face M3 are smoothly connected with each other at a predetermined curvature R. The face M3 may otherwise be a surface perpendicular to the base face KM. However, it is preferable the face M3 have an inclination in a direction to approach the rear face HM as the face M3 is away from the bottom face BTM.

The control unit 50 has an angle θa of 75° shown in FIG. 1, allowing the dock portion 7 to be inclined slightly upward. In an area on the right side of the shelf portion 6, there is provided an operating portion 8 having a plurality of operation buttons for operating the control unit 50. Examples of the operation buttons include a power ON/OFF, input selection, forward/reverse of reproduction contents, and the like.

The dock portion 7 is as a whole flat; however, it is partitioned from the viewpoint of design such that two divided parts are recognized. Specifically, a line portion 9 is provided which extends upward and downward with a predetermined width W1. The line portion 9 is, for example, another member which is so finished as to be recognized as a portion different from other portions and is fitted in. Rather than being another member, the line portion 9 may alternatively be the same member which is distinguished from other portions by changing surface roughness, painting and the like. The line portion 9 may protrude beyond the other surface of the dock portion 7; however, it is preferable that the line portion 9 have a flush face or a dented face. Providing the dock portion 7 with the line portion 9 allows the dock portion 7 to be visually recognized to have two regions, that is, a left dock region DR1 on the left side and a right dock region DR2, with respect to the line portion 9.

The line portion 9 may be disposed in the center in the right-left direction of the dock portion 7. However, it is preferable that the line portion 9 be disposed in a position deviated rightward or leftward. In the control unit 50 shown in FIG. 1, the line portion 9 is disposed in a position deviated rightward. Thus, the left dock region DR1 is larger than the right dock region DR2.

An open portion 9k is formed in substantially the center in the upward-downward direction of the line portion 9. The open portion 9k has a push-in portion 10 which is a member different from the line portion 9 and can be pushed-in by a finger. Pressing the push-in portion 10 unlatches a latch (to be described below), to thereby expose a connector (to be described below) outside which is used for attaching a mobile terminal device. Details of this structure will be described below.

The right dock region DR2 has an open portion 1k which is substantially rectangular. A door portion 11 which is rectangular and made of a member different from other portions is provided for the open portion 1k such that the door portion 11 is visible. Pressing the door portion 11 unlatches a latch (to be described below) and rotate the latch, to thereby expose another connector (to be described below) outside which is used for attaching a mobile terminal device. Details of this structure will be described later. In the basic state, a cosmetic face 11a of the door 11 is exposed.

The control unit 50 is so configured that one mobile terminal device can be connected to each of the left dock region DR1 and the right dock region DR2. The left dock region DR1 and the right dock region DR2 respectively can hold mobile terminal devices each of which has a configuration of a predetermined range. According to this embodiment, as an example, the control unit 50 capable of connecting thereto two mobile terminal devices will be set forth. Since the line portion 9 is deviated rightward in the control unit 50, the left dock region DR1 is larger and capable of holding a mobile terminal larger than that of the right dock region DR2. For example, the left dock region DR1 can connect thereto and hold a tablet-type mobile terminal. Meanwhile, the right dock region DR2 is so made as to connect thereto and successfully hold a mobile terminal device such as a small mobile music player and a smartphone. For preventing scratches or slidings which may be caused in holding the tablet-type mobile terminal, the left dock region DR1 has three pad members 12 made of rubber sponge or the like, one in the dock portion 7 and two in the shelf portion 6. For preventing the mobile terminal from directly touching the housing 1, the pad member 12 is so configured to have a pad face which is slightly protruding from the surface of the housing 1. In the basic state shown in FIG. 1, the dock portion 7 has substantially a flush face (no irregularities) including the line portion 9 and the door portion 11, other than the pad member 12.

Figure 2:
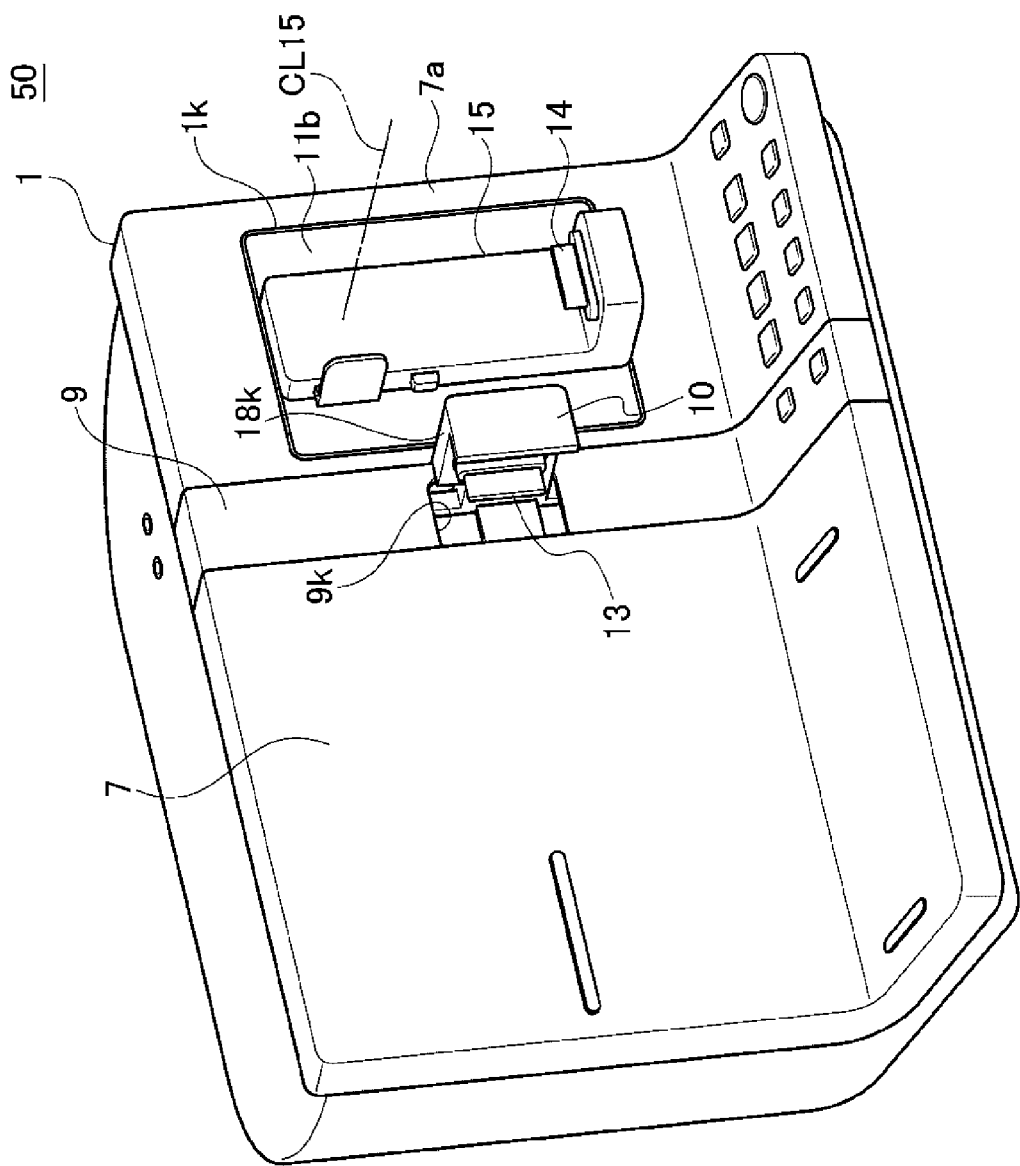
FIG. 2 is an external perspective view showing a connection state of the electronic device according to the embodiment of the present invention.

FIG. 2 shows a connection state of the control unit 50. Referring to FIG. 1 and FIG. 2, a transition from the basic state to the connection state will be set forth.

In the basic state shown in FIG. 1, pushing-in the push-in portion 10 unlatches the latch and then the push-in portion 10 will pop up to protrude from the surface of the dock portion 7 by means of a biasing force of a biasing member as will be described later. A connector 13 is integrated with the push-in portion 10. The popping-up of the push-in portion 10 exposes the connector 13 to the outside. Thus, the connector 13 is so made as to go in or out relative to the housing 1, that is, the connector 13 is placed in the housing 1 in an ordinary state and is exposed to the outside in the connection state. The connector 13 in the exposed state is so made as to protrude toward one sideward direction. In the control unit 50, the connector 13 protrudes leftward. Thus, the mobile terminal device attached to the left dock region DR1 does not extend rightward beyond the line portion 9, except for a particular configuration of the mobile terminal device. That is, even when the configuration or size of the mobile terminal device connected to the connector 13 is different, the mobile terminal device can be attached to the left dock region DR1 without affecting the attachment of the mobile terminal device in the right dock region DR2.

Meanwhile, pushing-in by finger an area near a right end portion of the door portion 11 will release the engagement of the door portion 11 by the latch (not shown) to thereby rotate the door portion 11 and expose a cradle support face 11b which is a face other than the cosmetic face 11a. That is, the cosmetic face (second face) 11a and the cradle support face (first face) 11b are exposed selectively. On the cradle support face 11b, a cradle 15 integrated with a connector 14 which is connectable thereto the mobile terminal device is so supported as to rotate around a rotation axis line CL15 (to be described below). Thus, the connector 14 is so made as to go in or out relative to the housing 1, that is, the connector 14 is received in the housing 1 in the ordinary state and is exposed to the outside in the connection state. In the control unit 50, the rotation axis line CL15 is so set as to be perpendicular to the cradle support face 11b. In the connection state of the control unit 50, the cradle support face 11b is so set as to be substantially flush with the surface of the dock portion 7. Specifically, in the right dock region DR2, the cradle support face 11b is substantially flush with a surrounding face 7a for surrounding the door portion 11 in the dock portion 7.

In the above descriptions, the connection state of exposing to the outside both of the connector 13 and the connector 14 relative to the housing 1 has been explained, for convenience sake. However, each of the connector 13 and the connector 14 independently may have the basic state where the connector 13 or 14 is received inside the housing 1 and the connection state where the connector 13 or 14 is exposed to the outside.

Next, the going-in and out structure of each of the connectors 13, 14 will be explained in detail.

<Going-In and Out Structure of Connector 13>

Figure 3:
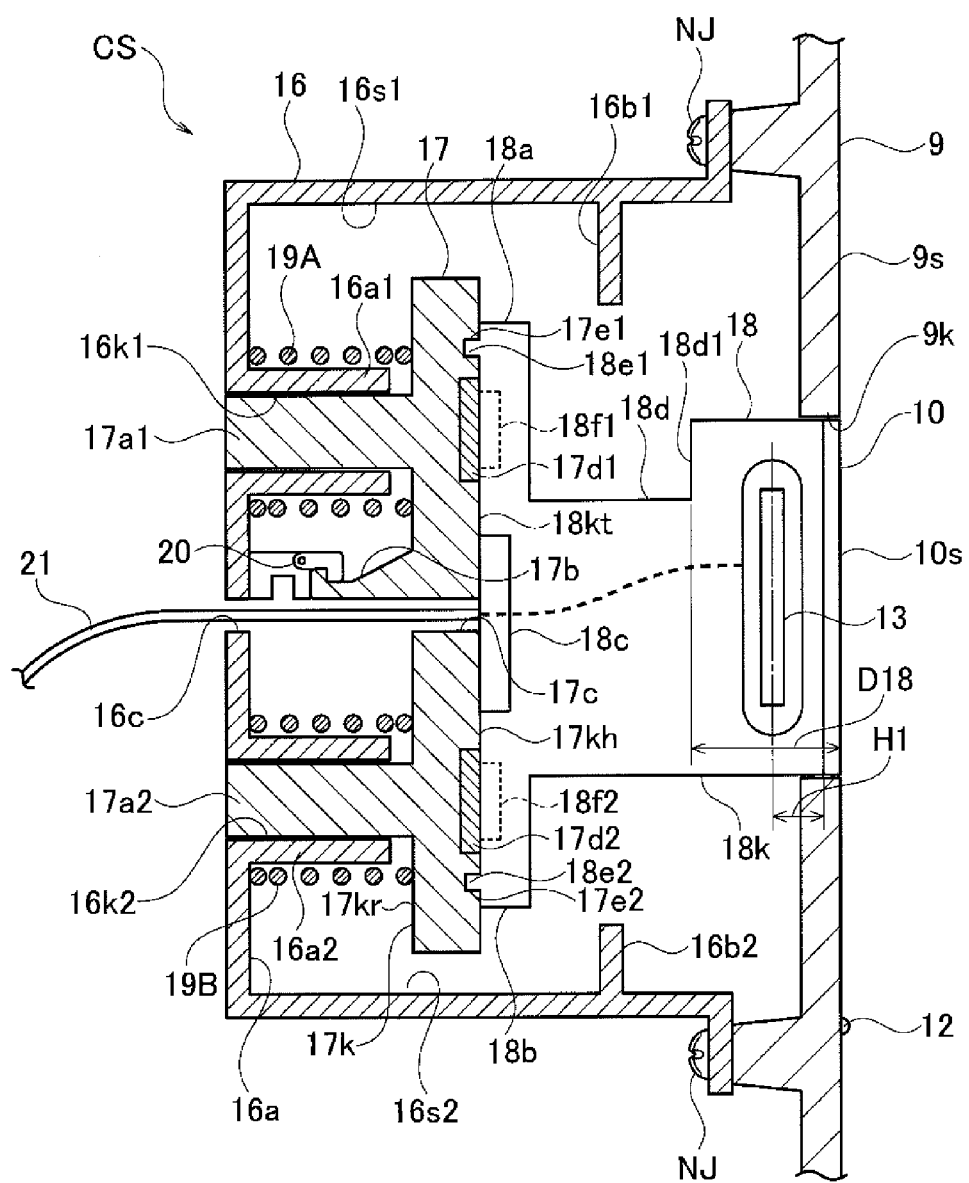
FIG. 3 is a cross sectional view showing a basic state for explaining a connector structure employed in the electronic device according to the embodiment of the present invention.

First, the going-in and out structure of the connector 13 will be described in detail by using FIG. 3 to FIG. 6. The going-in and out of the connector 13 is accomplished by a connector connecting portion CS. FIG. 3 is a cross section viewed in the direction denoted by A-A in FIG. 1. In FIG. 3, for ease of understanding, a C holder 18 (to be described later) is shown by a plan view instead of a cross sectional view.

In FIG. 3, the connector connecting portion CS is so configured as to include a connector box (hereinafter referred to as C box) 16 as a base body, a slider 17 received in the C box 16 and moveable in an axial direction (right-left direction in FIG. 3), a connector holder (hereinafter referred to as C holder) 18 adsorbed to the slider 17 by a magnetic force, a pair of coil springs 19A, 19B as a biasing member, and a latch device 20.

The C box 16 is formed into substantially a box having the right side which is open in FIG. 3. The C box 16 is made of resin material. Examples of the material include ABS (acrylonitrile butadiene styrene) resin. A bottom face 16a of the C box 16 is formed with a pair of columnar portions 16a1, 16a2 which are spaced apart in the upward-downward direction in FIG. 3. The columnar portions 16a1, 16a2 are respectively formed with through holes 16k1, 16k2. In a portion between the pair of columnar portions 16a1, 16a2 in the bottom face 16a, a through open portion 16c is formed and the latch device 20 is mounted. An open end side of the C box 16 is screwed up to a rear face side of the line portion 9 by a male screw NJ. In a position near the open end at a pair of inner faces 16s1, 16s2 of the C box 16, protruding ribs 16b1, 16b2 are so formed as to approach the opposing inner faces 16s1, 16s2.

The slider 17 is so formed as to have a flat base portion 17k, and a pair of bosses 17a1, 17a2 disposed on a rear face 17kr (left face in FIG. 3) of the base portion 17k in such a manner as to be spaced apart in the upward-downward direction. The slider 17 is formed of a resin material, examples of the material including ABS resin. In the rear face 17kr, a raised arm portion 17b and a through open portion 17c are formed in a portion between the pair of bosses 17a1, 17a2. On a surface 17kh side of the base portion 17k, a pair of magnets 17d1, 17d2 are embedded in such a manner as to be spaced apart in the upward-downward direction. On both outer sides in the upward-downward direction of the magnets 17d1, 17d2, a pair of slits 17e1, 17e2 are formed.

Figure 6:
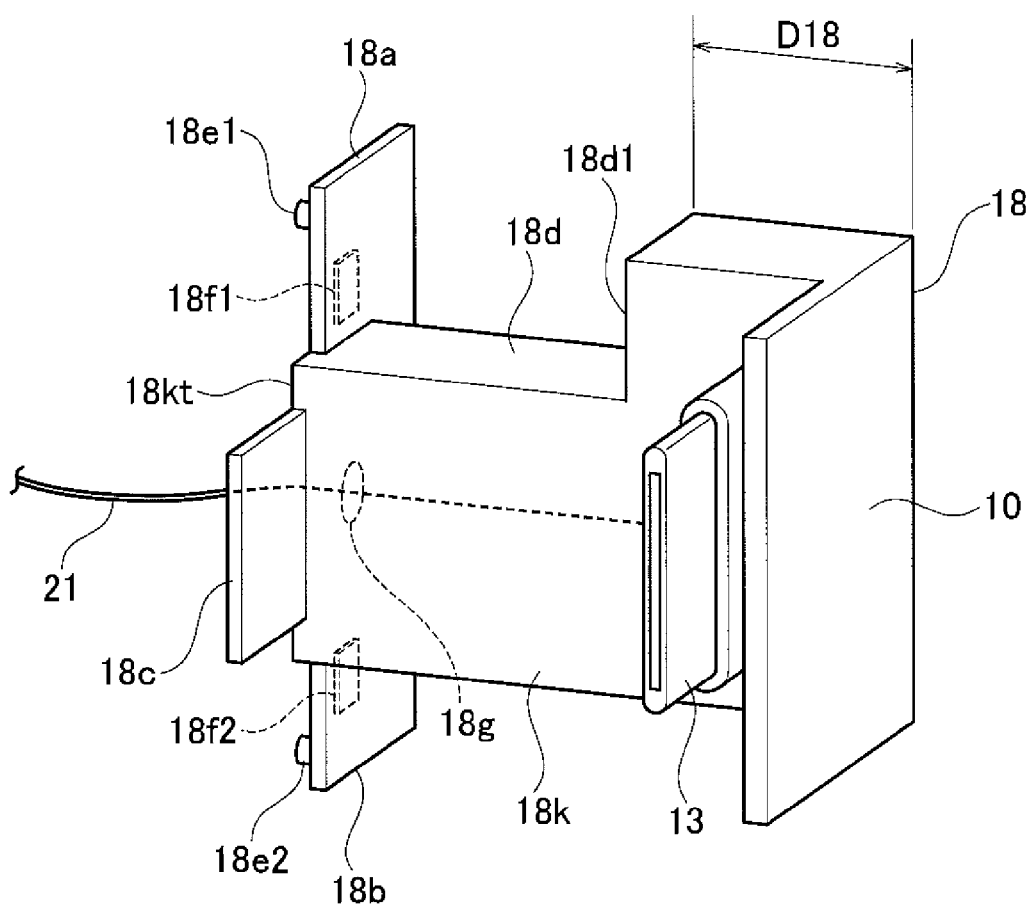
FIG. 6 is a perspective view for explaining essential members of the connector structure employed in the electronic device according to the embodiment of the present invention.

Next, the C holder 18 will be described in detail referring to FIG. 3 in combination with FIG. 6.

The C holder 18 is made of a resin material. Examples of the material include an ABS resin. The C holder 18 is so formed as to have a base portion 18k which is substantially flat and extends in a direction along the plane of paper of FIG. 3, the flat push-in portion 10 perpendicularly extending from one end edge of the base portion 18k, the connector 13 disposed on one end side of the base portion 18k in such a manner as to protrude in the same direction as that of the push-in portion 10 substantially in parallel with the push-in portion 10, and three flange portions 18a, 18b and 18c extending from the other end edge of the base portion 18k respectively in an upward direction, a downward direction, and on the near side of the plane of paper of FIG. 3.

The base portion 18k is formed with a cutout portion 18d which is made by cutting off a predetermined region into a rectangular shape from the other end edge side toward one end side. An end portion 18d1 on the one end side of the cutout portion 18d is disposed in a position away from an outer surface 10s of the push-in portion 10 by a distance D18. The flange portion 18a and the flange portion 18b extand from the base portion 18k and are connected with each other at the back side in FIG. 6 also. The other end side of each of the flange portions 18a, 18b, 18c and the base portion 18k becomes a flat end face 18kt. A pair of magnetic bodies 18f1, 18f2 are embedded in the end face 18kt in such a manner as to be spaced apart in the upward-downward direction. Examples of the magnetic body include an iron plate. On both outer sides in the upward-downward direction of the pair of magnetic bodies 18f1, 18f2, a pair of dowels 18e1, 18e2 are formed respectively. In the C holder 18, an open passage is formed which communicates to the connector 13 from an open portion 18g (see FIG. 6) disposed on the other end side face of the base portion 18k. A cable 21 having one end side connected to the connector 13 is pulled out to the outside via the open portion 18g. The other end side of the cable 21 is connected to the circuit portion 2. The coil springs 19A, 19B respectively fit over the columnar portions 16a1, 16a2. One end side of each of the coil springs 19A, 19B touches the bottom face 16a while the other end side of each of the coil springs 19A, 19B touches the rear face 17kr of the base portion 17k of the slider 17, setting dimensions of the coil springs 19A, 19B such that the coil springs 19A, 19B can be constantly compressed in the abutting state on both sides.

The members set forth above are combined in the following manner. First, an explanation will be made based on the basic state shown in FIG. 3.

A pair of bosses 17a1, 17a2 of the slider 17 are respectively inserted into a pair of through holes 16k1, 16k2 at the respective columnar portions 16a1, 16a2 of the C box 16. The slider 17 is moveable in the right-left direction in FIG. 3 relative to the C box 16. The arm portion 17b of the slider 17 is engaged with the latch device 20. When the L-shaped arm portion 17b is pushed-in from the right side to the left side, the latch device 20 is engaged with a head end of the arm portion 17b to thereby hold the arm portion 17b. It is so configured that, when the arm portion 17b is again pushed-in leftward from this state, the above engagement is disengaged to thereby release the arm portion 17b. Thus, in the basic state in FIG. 3, the arm portion 17b is engaged with the latch device 20 and thereby is held to the latch device 20, and the slider 17 is prevented from making a rightward movement in FIG. 3.

The magnets 17*d*1, 17*d*2 provided for the slider 17 and a pair of magnetic bodies 18*f*1, 18*f*2 of the C holder 18 are disposed in positions where respective members correspond to each other. The above corresponding members are pulled toward each other by a magnetic force, to thereby allow the surface 17*kh* of the base portion 17*k* of the slider 17 to touch the end face 18*kt* of the C holder 18. In this basic state, dimensions and the like of the outer surface 10*s* of the push-in portion 10 are so set that the outer surface 10*s* is substantially flush with the outer surface 9*s* of the line portion 9 without unevenness.

In the basic state, when the push-in portion 10 is pushed-in leftward in FIG. 3 by the user's finger and the like, the engagement of the latch device 20 is disengaged, to thereby release the arm portion 17*b*. Then, the slider 17 moves rightward in FIG. 3 together with the C holder 18 by means of a biasing force of the coil springs 19A, 19B. When the slider 17 moves a predetermined distance, the ribs 16*b*1, 16*b*2 of the C box 16 respectively touch both upward-downward end portions of the base portion 17*k* of the slider 17, to thereby restrict the movement of the slider 17. That is, each of the ribs 16*b*1, 16*b*2 functions as a restriction member for restricting the movement of the slider 17 (slider restriction portion).

Figure 4:
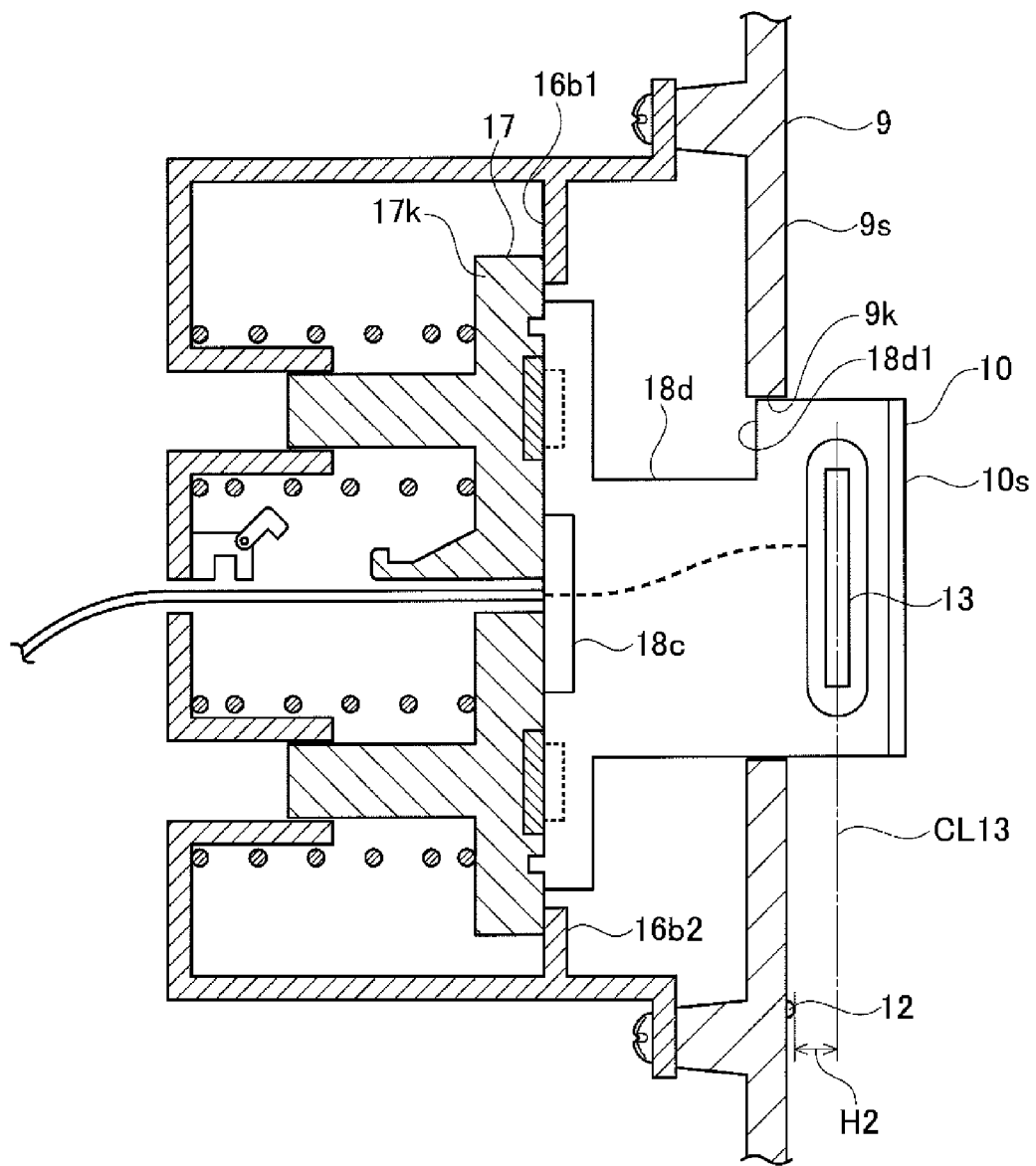
FIG. 4 is a cross sectional view showing a PU state of the connector structure employed in the electronic device according to the embodiment of the present invention.

FIG. 4 shows a state where the above movement is restricted. Hereinafter, this state is referred to as a pop up state (PU state). In the PU state, the cutout portion 18*d* of the C holder 18 is so made as not to be exposed outside from the open portion 9*k*. Specifically, the end portion 18*d*1 on the cutout portion 18*d*'s connector 13 side is positioned inside of the outer surface 9*s*.

In the PU state, a distance H2 between an apex of the pad member 12 and a center axis line CL13 of the connector 13 is so made as to correspond to a distance between an outer face of a certain mobile terminal device and a center axis line of a connector of the certain mobile terminal device which is likely to be most frequently attached among those which are connectable to the connector 13 and which can be held to the left dock region DR1. The position in the upward-downward direction of the connector 13 is so set that a lower face of the certain mobile terminal device that is most frequently attached touches the pad member 12. Thus, the connector 13 can be attached easily to the connector of the mobile terminal device by allowing the C holder 18 to be in the PU state and sliding the mobile terminal device (to be attached) in a state of touching the pad member 12.

Figure 5:
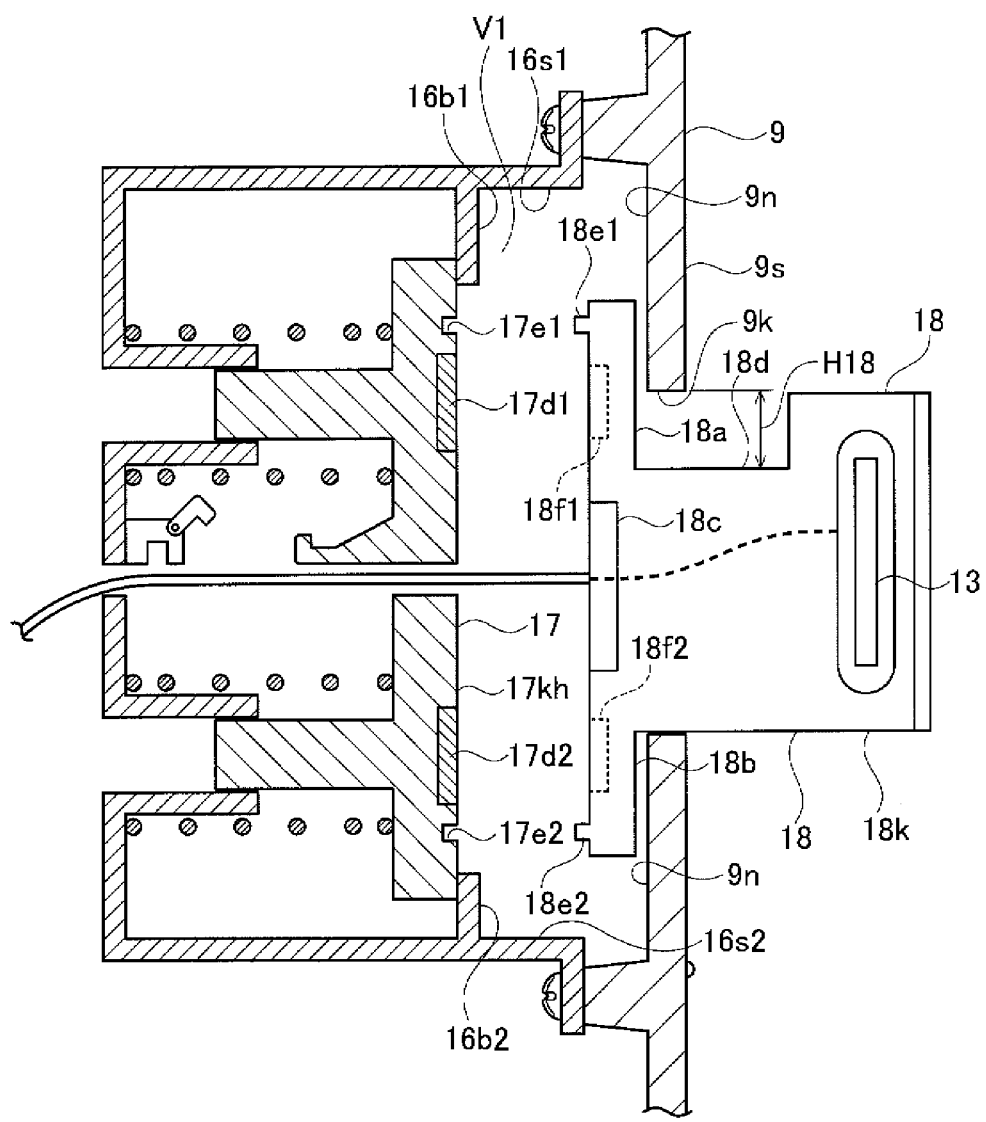
FIG. 5 is a cross sectional view showing a free state of the connector structure employed in the electronic device according to the embodiment of the present invention.

In the PU state, by applying to the C holder 18 a force against the magnetic force of the magnets 17*d*1, 17*d*2 so as to move the C holder 18 more rightward than that in FIG. 4, the C holder 18 can be separated from the slider 17 and the C holder 18 moves to be in a free state. In this free state, FIG. 5 shows a state where the C holder 18 is positioned slightly inward than the state in which the C holder 18 is most outwardly exposed. The most outwardly exposed state is referred to as a most protruding state.

In the most protruding state (including PU state) relative to the state in FIG. 5, the right face of each of the flange portions 18*a* to 18*c* of the C holder 18 in FIG. 5 touches an inner face 9*n* of the line portion 9, forming a space V1 surrounded by the surface 17*kh* of the slider 17, the ribs 16*b*1, 16*b*2, the inner faces 16*s*1, 16*s*2 of the C box 16 and the inner face 9*n* of the line portion 9. Configuration of each of the flange portions 18*a* to 18*c* and the opening dimension of the open portion 9*k* are so set that the C holder 18, at least in the free state where the slider 17 touches the ribs 16*b*1, 16*b*2, does not become disengaged outside from the open portion 9*k* of the line portion 9. Thus, the C holder 18 can freely take any attitudes as long as the flange portions 18*a* to 18*c* are in the space V1. That is, the surface 17*kh* of the slider 17, the ribs 16*b*1, 16*b*2, the inner faces 16*s*1, 16*s*2 of the C box 16 and the inner face 9*n* of the line portion 9 function as a restriction portion that spatially restricts, in a predetermined range, the position and attitude which may be taken by the C holder 18 in the free state. In addition, forming the cutout portion 18*d* forms a gap of a distance H18 relative to the open portion 9*k* in the upward-downward direction. Thus, the position of the connector 13 can be moved vertically by the distance H18. By this operation, the range which may be taken by the position or attitude of the C holder 18 is more extended, thus making it easy to attach the connector 13 to the mobile terminal device to be attached to the left dock region DR1 and making it possible to hold, in the left dock region DR1, the mobile terminal devices having more various configurations.

For accomplishing the transition from the most protruding state to the PU state, the C holder 18 is moved leftward in FIG. 5. By this operation, a magnetic pulling force between a pair of magnets 17*d*1, 17*d*2 and a pair of magnetic bodies 18*f*1, 18*f*2 corresponding thereto allows respective members to have predetermined positions relative to each other, and finally, the slits 17*e*1, 17*e*2 mate respectively with the dowels 18*e*1, 18*e*2, to thereby position the slider 17 and C holder 18 and integrate the slider 17 with the C holder 18. Further, for accomplishing the transition from the PU state to the basic state, the C holder 18 integrated with the slider 17 is to be further pushed-in. This push-in operation allows the latch device 20 to hold the arm portion 17*b* of the slider 17, thus leading to the basic state.

In the going-in and out structure of the connector 13, the outer surface 10*s* of the C holder 18 in the basic state is flush with the surrounding faces causing no irregularities, thereby improving the external view quality. In the PU state, the connector 13 is held in the predetermined protruding position, thereby making it extremely easy to connect the connector of the mobile terminal device that fits the predetermined protruding position. In the free state where the slider 17 is separated from the C holder 18, the C holder 18 can take the free attitude and the position of the connector 13 can be moved freely in the space in the predetermined range, thus making it possible to connect the connectors of the mobile terminal devices having various sizes and configurations. For example, a mobile terminal device having an abnormal configuration, such as one that is thick due to a cover attached thereto, can be connected. Further, the most protruding state for restricting the protrusion amount of the C holder 18 as a predetermined amount is set, thus it is unlikely that the C holder 18 is protruded more than necessary even when an unexpected external force is applied to the C holder 18, thereby preventing a breakage of the C holder 18 or a cable breakage. Further, even in the free state, the user pinching the C holder 18 by finger can allow the C holder 18 in a desired attitude while feeling the magnetic pulling force by the magnets, thus allowing the user to have an extremely good operation feeling.

<Going-In and Out Structure of Connector 14>

Figure 7:
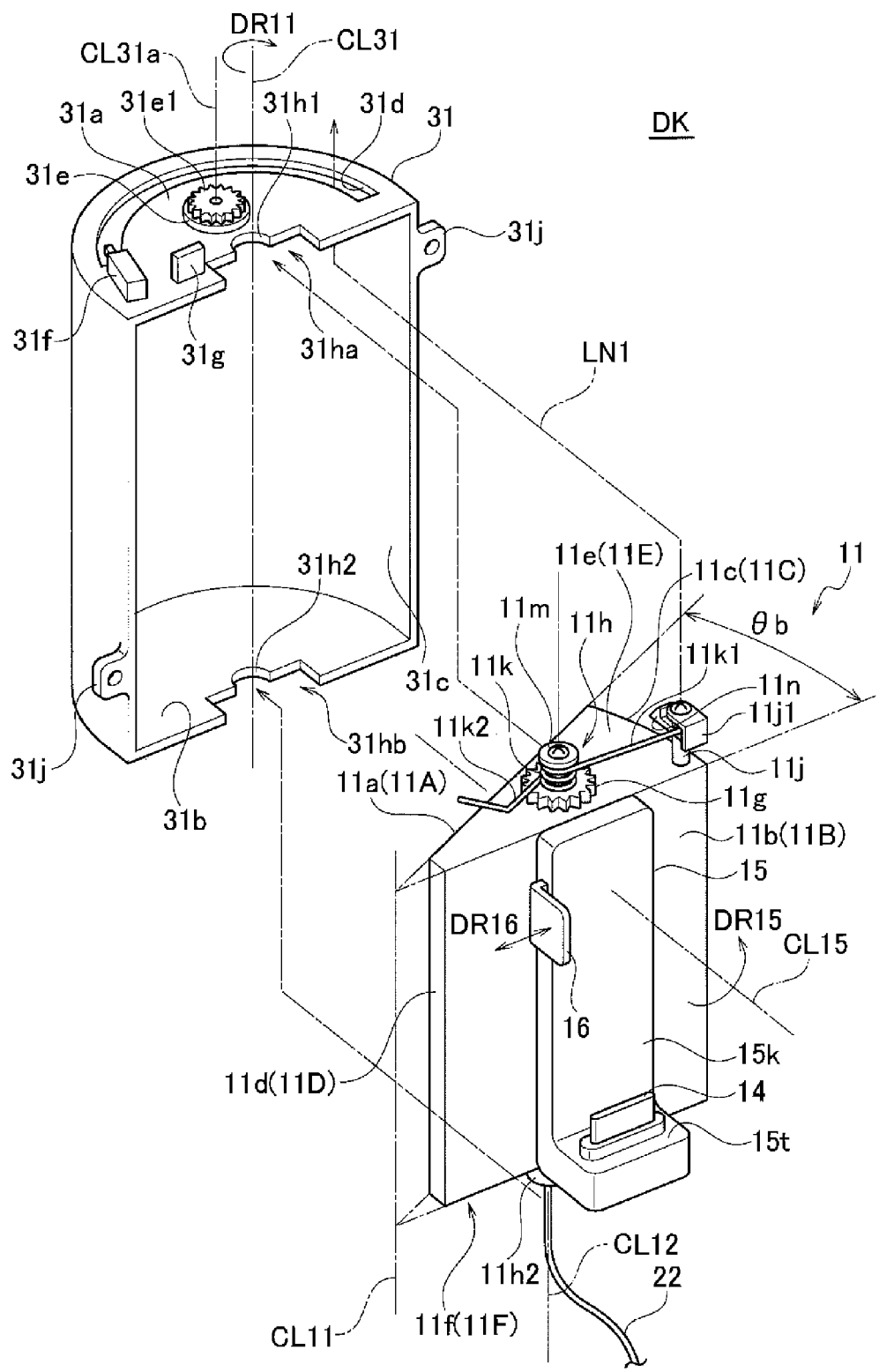
FIG. 7 is an exploded perspective view for explaining the structure of essential portions of the electronic device according to the embodiment of the present invention.

Next, the going-in and out structure of the connector 14 will be described in detail, referring to FIG. 7 to FIG. 9. The going-in and out of the connector 14 is accomplished by a door rotation portion DK. FIG. 7 is an exploded perspective view explaining the structure of the door rotation portion DK.

The door rotation portion DK is so configured as to include a door box portion 31 formed into a half-tube having a lateral cross section which is substantially an arc and a door portion 11 which is engageable with the door box portion 31 and rotates around a predetermined axis line in a space in the door box portion 31.

The door box portion 31 is, at both ends thereof, formed with wall portions 31a, 31b. An inner peripheral face 31c of the door box portion 31 is formed as a part of a circumferential face around a center axis line CL31. The wall portion 31a is formed with an arc slit 31d around the center axis line CL31. A latch device 31f is mounted near one end of the slit 31d on the wall portion 31a, and a rib 31g is formed near the latch device 31f. Further, the wall portion 31a is provided with a viscous damper 31e having a pinion 31e1 which rotates around a center axis line CL31a parallel to the center axis line CL31. The wall portions 31a, 31b are respectively formed with cutout portions 31ha, 31hb which respectively include arc portions 31h1, 31h2 around the center axis line CL31. A plurality of ribs 31j each extending outward and having a through hole are provided on an open end side. The rib 31j is used for screw-fixing the door rotation portion DK to the front cover 1F (not shown in FIG. 7).

The door portion 11 is formed as a pillar having a lateral cross section formed into a substantially fan-like shape. Specifically, the door portion 11 is so configured as to include a cosmetic face portion 11A having the cosmetic face 11a which is flat and has substantially no irregularities, a cradle support portion 11B having a cradle support face 11b formed in a plane which intersects at an imaginary intersection line CL11 with a plane that includes the cosmetic face 11a and forms an angle θb with the plane including the cosmetic face 11a, a peripheral face portion 11C having an arc peripheral face 11c around the imaginary intersection line CL11, an end face portion 11D having an end face 11d which is in a shape of an arc around the imaginary intersection line CL11, which is smaller in diameter than the peripheral face 11c and which is opposed to the peripheral face 11c, and wall face portions 11E, 11F respectively having wall faces 11e, 11f which block both end portions. The angle θb is for example 25°.

The cradle support portion 11B is provided with a cradle 15 protruding relative to the cradle support face 11b which substantially has a flat face. The cradle 15 has a side view shaped into substantially an L shape and is so configured as to have a base portion 15k opposite the cradle support face 11b closely situated thereto and a shelf portion 15t bent substantially perpendicularly from the base portion 15k. The connector 14 is mounted to the shelf portion 15t in such a manner as to protrude substantially in parallel to the base portion 15k. At one side face of the base portion 15k, a guide 16 is provided which can move inward and outward at a predetermined stroke in the direction DR16 indicated by an arrow in FIG. 7. The above inward-outward movement is so made as to cause a click feeling at a predetermined interval. Further, a lock mechanism for selecting prohibition and permission of the inward-outward movement may also be provided. The cable 22 with one end side connected to the connector 14 passes through inside of the cradle 15 and is pulled outward through an columnar shaft portion 11h2 which will be described later. The other end side of the cable 22 is connected to the circuit portion 2.

The cradle 15 is so made as to rotate around a cradle rotation axis line CL15 (hereinafter simply referred to as rotation axis line CL15) set at an end opposite to the shelf portion 15t. The rotation axis line CL15 is set as an axis line perpendicularly intersecting the cradle support face 11b. That is, when the cradle support face 11b is selectively exposed, the cradle 15 can rotate in a plane parallel to the cradle support face 11b. In the door rotation portion DK, the cradle 15 is so configured as to rotate about 90° in the counterclockwise direction (direction DR15 indicated by arrow in FIG. 7) from the attitude shown in FIG. 7. Specifically, a click feeling is given to the cradle 15 in the positions of 0° and 90°, and the cradle 15 is so held as to maintain its attitude below a predetermined rotational force applied from outside. Hereinafter, the attitude of the cradle 15 shown in FIG. 7 is referred to as a longitudinal attitude and the attitude of the cradle 15 rotated 90° is referred to as a lateral attitude. In the longitudinal attitude, entirety of the cradle 15 is so made as to be received in the cradle support face 11b. Further, the cradle 15 in the longitudinal attitude is so configured as not to interfere with other members during the rotation of the door portion 11. Further, making the configuration of the cradle 15 in the longitudinal attitude such that it does not interfere with other members in the rotation of the door portion 11 is merely an example. In other words, any configuration of the cradle 15 is possible provided that the configuration is made such that there is no interference with other members during the rotation of the door portion 11 with at least one possible attitude which may be taken by the cradle 15. Further, in the state of the lateral attitude with the cradle 15 rotated 90°, the shelf portion 15t side is so made as to extend laterally from the cradle support face 11b. Further, in the control unit 50, for allowing the lateral attitude of the cradle 15, the cradle support face 11b is formed such that it is at least not dented relative to the surrounding face 7a. In other words, the cradle support face 11b is flush with or protruding relative to the surrounding face 7a. The cradle support face 11b described above allows the cradle 15 to be supported in such a manner as to rotate in the plane parallel to the cradle support face 11b. Thus, when the cradle support face 11b is selectively exposed, the cradle 15 can rotate without being restricted by the surrounding face 7a. Further, when the cradle support face 11b is protruding relative to the surrounding face 7a, it is preferable the cradle support face 11b be in parallel with the surrounding face 7a so as not to restrict the rotation of the cradle 15.

A rotation axis line CL12 is imaginarily set for the door portion 11. On the wall face 11e, a shaft 11h protrudes with the rotation axis line CL12 as a center axis. On the wall face 11f as well, a columnar shaft portion 11h2 is formed with the rotation axis line CL12 as a center axis. The rotation axis line CL12 is so set as to match the center axis line CL31 when the door portion 11 is assembled with the door box portion 31 as the door rotation portion DK. The rotation axis line CL12 has an inclination which is the same as that of a dock portion 7. Specifically, the rotation axis line CL12 is set to be parallel to the surrounding face 7a. The position of setting the rotation axis line CL12 in the door portion 11 will be described below. A gear 11g is formed integrally with the shaft portion 11h. Further, a boss 11j stands on the peripheral face portion 11C side of the wall face 11e. A magnetic piece 11j1 made of a magnetic material is mounted to the boss 11j. An arm portion 11n engageable with the latch device 31f is provided for the boss 11j. A coil portion of the torsional coil spring 11k as a biasing member is fitted in the shaft portion 11h, with one arm 11k1 latched to the boss 11j and the other arm 11k2 set free. A flat washer 11m is screw-fixed to the head end of the shaft portion 11h, thus preventing removal of the torsional coil spring 11k.

The door portion 11 is assembled to the door box portion 31 by inserting the boss 11j from inside (refer to a dashed-dotted line LN1), mating the shaft portion 11h with the arc portion 31h1 and mating the shaft portion 11h2 with the arc portion 31h2. In this state, the gear 11g is so made as to mesh with the pinion 31e1. Further, the arm 11k2 of the torsional coil spring 11k is hooked with the rib 31g. By this operation, the door portion 11 is biased in the clockwise direction with respect to the center axis line CL31 in FIG. 7 (direction DR11 indicated by arrow in FIG. 7). The clockwise rotation is restricted by the boss 11j touching the right end of the slit 31d.

The door rotation portion DK is mounted to the rear face side of the front cover 1F. With the door rotation portion DK thus mounted, the cosmetic face 11a or cradle support face 11b of the door portion 11 is so made as to be visible from the open portion 1k. In this case, it is so set that substantially no gap is defined between the cosmetic face 11a or cradle support face 11b and the open portion 1k of the housing 1, and the cosmetic face 11a or the cradle support face 11b is substantially flush with the face around the open portion 1k without irregularities. When the door portion 11 is biased by the torsional coil spring 11k to be most rotated in the direction DR11, correspondingly, the magnetic piece 11j1 is made to come close to or touch a magnet (not shown) provided on the rear face of the housing 1. Thus, when the user tries to press the right edge of the door portion 11 by finger with a force greater than or equal to a total force of the biasing force of the torsional coil spring 11k and the magnetic force by the magnet (not shown), the door portion 11 will rotate in the counterclockwise direction (opposite to the direction DR11 indicated by arrow). When the angle θb is 25°, rotating the door portion 11 by 155° can switch the face visible in the open portion 1k between the cosmetic face 11a and the cradle support face 11b. Further, since the door portion 11 is formed as a pillar having the lateral cross section formed into a substantially fan-like shape, rotating the door portion 11 by only 155° which is less than 180° can switch the face visible in the open portion 1k between the cosmetic face 11a and the cradle support face 11b.

FIG. 8A and FIG. 8B are pattern diagrams for explaining the above described rotation. The explanation will be made hereinafter by referring also to FIG. 7. FIG. 8A corresponds to the attitude of the door portion 11 shown in FIG. 7, and is a pattern diagram showing that a state in which the door portion 11 is rotated in the most clockwise direction is viewed from an upper side. FIG. 8B is a pattern diagram showing that a state in which the door portion 11 is rotated in the most counterclockwise direction is viewed from an upper side.

In the state in FIG. 8B, an arm portion of the boss 11j is latched to the latch device 31f against the biasing force of the torsional coil spring 11k, thus holding the door portion 11 in this attitude. In the state in FIG. 8B, pressing at one time the right side of the cosmetic face 11a of the door portion 11 in a direction DRP indicated by the arrow releases the arm portion's engagement with the latch device 31f, and then the biasing force of the torsional coil spring 11k rotates the door portion 11 clockwise, thus accomplishing a transition to the state in FIG. 8A.

The cradle support face 11b in the state in FIG. 8A is in the position which is the same as that of the cosmetic face 11a in the state in FIG. 8B. Thus, in the state in FIG. 8A, the surrounding face 7a of the dock portion 7 and the cradle support face 11b are substantially flush with each other, while in the state in FIG. 8B, the surrounding face 7a of the dock portion 7 and the cosmetic face 11a are substantially flush with each other. This is attributable to the setting that, as shown in FIG. 8A, the position of the rotation axis line CL12 is so set that the distance L11a from the rotation axis line CL12 to the cosmetic face 11a is equal to the distance L11b from the rotation axis line CL12 to the cradle support face 11b. Further, the rotation axis line CL12 is positioned in the midpoint of the distance between the peripheral face 11c and the end face 11d opposing each other. That is, the peripheral face 11c and the end face 11d are formed by the same radius R1 around the rotation axis line CL12. By this configuration, the position of the cosmetic face 11a relative to the open portion 1k is not different from the position of the cradle support face 11b relative to the open portion 1k in the upper, lower, leftward, rightward, forward, and rearward directions. Thus, the gap between the cosmetic face 11a and the open portion 1k and the gap between the cradle support face 11b and the open portion 1k can be made small, making it possible to further improve the external view quality. In the door rotation portion DK, the inner peripheral face 31c of the door box portion 31 is also formed into an arc around the rotation axis line CL12.

FIG. 9 is a pattern diagram showing that a state where the cradle 15 in FIG. 8A is rotated counterclockwise by 90° with respect to the rotation axis line CL15 is viewed from the upper side (refer to FIG. 7). As is obvious from FIG. 9, when the cradle 15 is rotated in the state of FIG. 8A, that is, the state where the surrounding face 7a is substantially flush with the cradle support face 11b, the shelf portion 15t of the cradle 15 can rotate such that it overlaps with the surrounding face 7a, as shown in FIG. 9, thus making it possible for the cradle 15 to take the lateral attitude without trouble.

According to the going-in and out structure of the connector 14, when the cradle 15 having the connector 14 is exposed or stored, the respective cradle support face 11b and cosmetic face 11a are disposed in the face substantially flush with the surrounding face 7a therearound. This improves the external view quality. Further, when the cradle 15 is rotated, the cradle 15 can extend out of the region of the cradle support face 11b. That is, the configuration can be set in the thus rotated lateral attitude.

Figure 10:
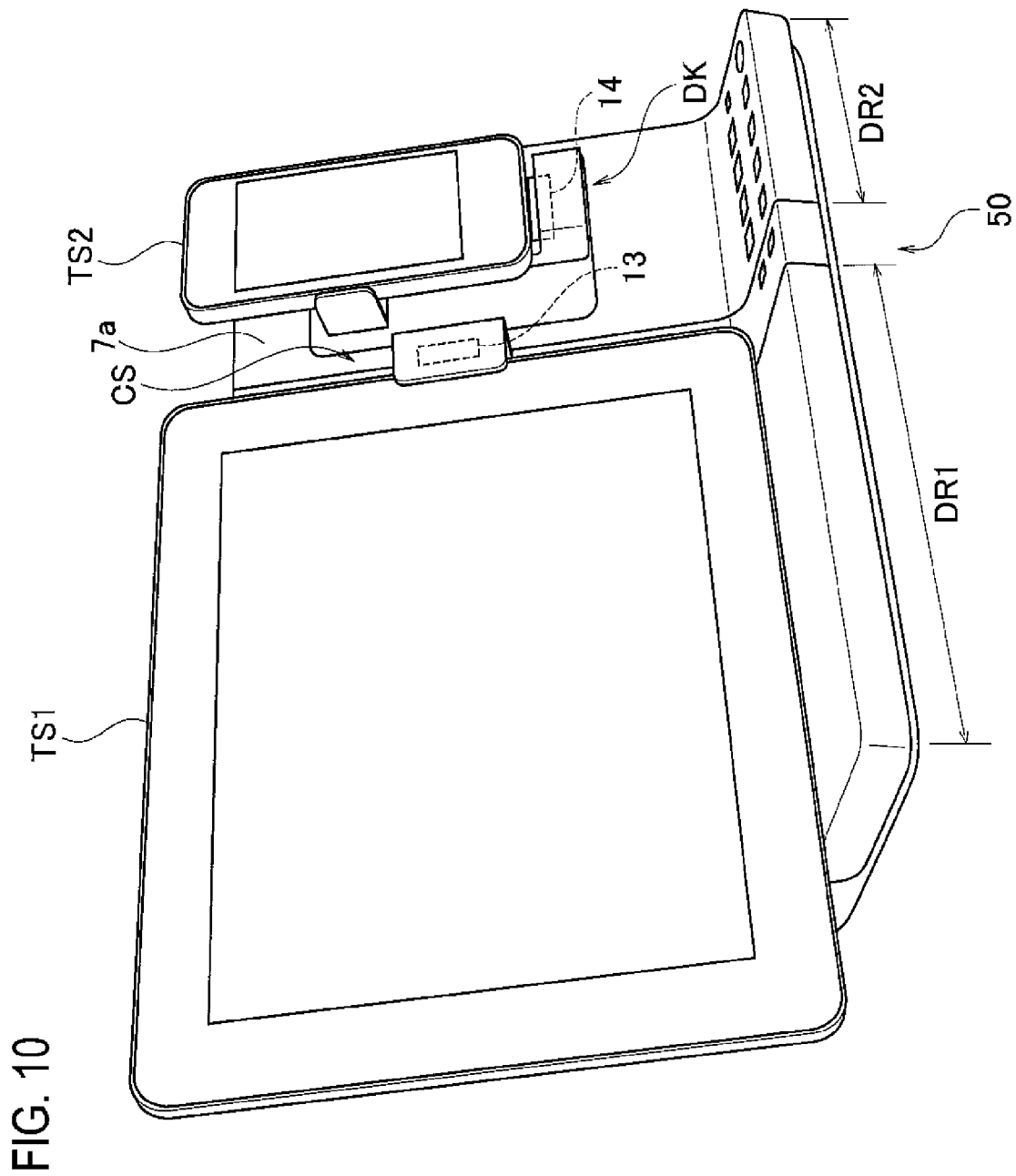
FIG. 10 is an external perspective view showing a state where mobile terminal devices are attached to the electronic device according to the embodiment of the present invention.

FIG. 10 is an external perspective view showing a state in which the mobile terminal device is connected and held to the control unit 50 which is an example of the electronic device provided with the above connector connecting portion CS and door rotation portion DK. It is shown that a tablet-type mobile terminal device TS1 is attached to the left dock region DR1 of the control unit 50 while a smartphone-type mobile terminal device TS2 is attached to the right dock region DR2. As described above, the control unit 50 can simultaneously mount the mobile terminal devices TS1, TS2 which are different in configuration. Further, the left dock region DR1 is provided with the connector connecting portion CS in which the position of the connector 13 can be changed freely within the predetermined space region, thus making it possible for the connector 13 to connect thereto mobile terminal devices having various configurations, especially ones having different thicknesses. Further, the right dock region DR2 is provided with the cradle 15 which allows the position of the connector 14 to be held in different attitudes, that is, the longitudinal attitude and lateral attitude which extends to the surrounding face 7a when rotated, thus making it possible for the connector 14 to connect thereto mobile terminal devices having different configurations. When not connected with the mobile terminal devices, the control unit 50 according to the embodiment can be stored in a housing without exposing the connectors for connection or without exposing the configuration (for connecting the mobile terminal devices) built around the connector. This can prevent a possible connection trouble which may be caused when an unexpected excessive external force is applied to the connector, and the external view quality of the electronic device can be highly maintained.

It is needless to say that the embodiment of the present invention is not limited to the structure or procedures stated above and therefore any modified examples not departing from the scope of the present invention are allowed.

The application of the connector connecting portion CS is not limited to electronic devices such as the control unit 50, and therefore the connector connecting portion CS is also applicable to other devices as long as such devices connect thereto and hold a connected device by a connector.

The angle θb at the door portion 11 is not limited to 25° and may be set arbitrarily. According to the embodiment, the two exposed faces 11a, 11b of the door portion 11 which were explained respectively as the cosmetic face 11a and cradle support face 11b are, when viewed from the rotation axis line CL12 side, set as two chords which do not intersect with each other, where the two chords are obtained when an arc around the rotation axis line CL12 is set. In other words, the cosmetic face 11a and the cradle support face 11b are set as two cut faces which are obtained by cutting a right circular cylinder around the rotation axis line CL12 by a flat face parallel to the rotation axis line CL12 and which do not intersect with each other. With this, by setting an open portion to have such a size as to accommodate any larger one of the two exposed faces 11a, 11b, it is possible to selectively expose the two faces. Further, it is more preferable that the two chords mutually have the same length. The control unit 50 shows this example. By this, the two exposed faces 11a, 11b are made to have the same size, making it possible to set the same gap relative to the open portion 1k. That is, the gap between the cosmetic face 11a and the open portion 1k and the gap between the cradle support face 11b and the door portion 11k can be set minimum. This further improves the external view quality of the control unit 50.

It is possible not to use a biasing member as a driving force for rotating the door portion 11. According to the embodiment, the structure of using the torsional coil spring 11k as a biasing member has been explained; however, another structure where a finger presses the door portion 11 to thereby rotate the door portion 11 also is possible. In such a structure, the gravity center G of the door portion 11 may be set in the following manner. A modified example will be set forth in detail by referring to FIGS. 11A and 11B.

Figure 11A:
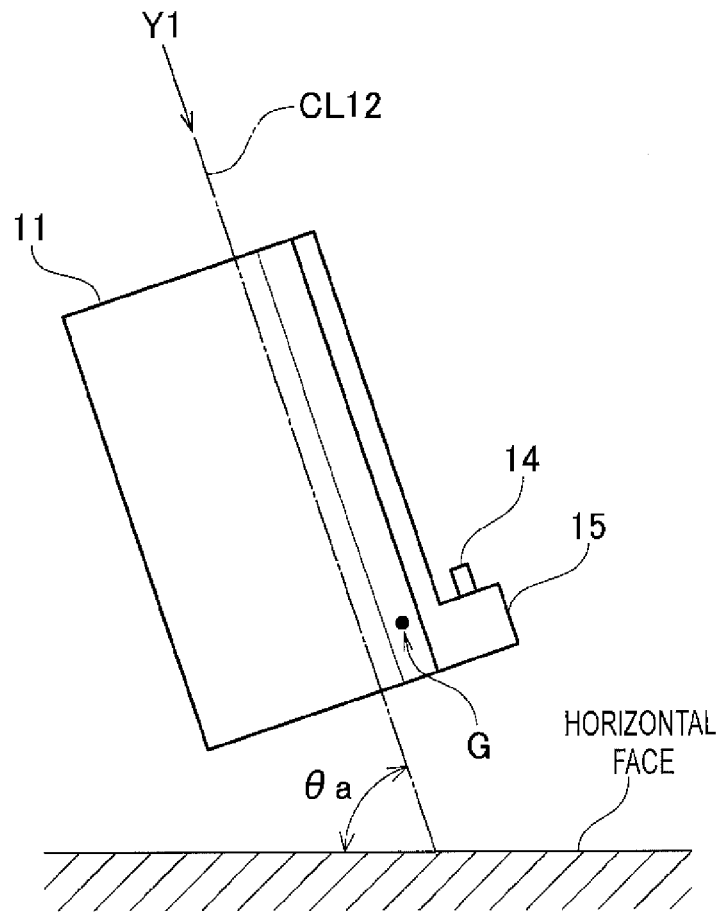
FIG. 11A is a pattern diagram for explaining a modified example of the electronic device according to the embodiment of the present invention.
Figure 11B:
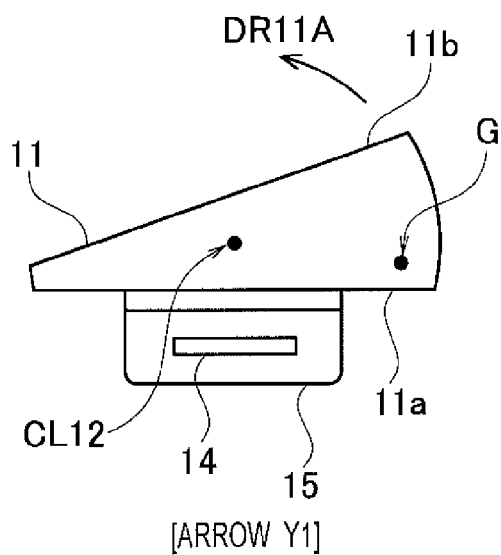
FIG. 11B is a pattern diagram for explaining the modified example of the electronic device according to the embodiment of the present invention.

FIGS. 11A and 11B are pattern diagrams for explaining the modified example of the door portion 11. FIG. 11A is a side view showing only the door portion 11 viewed from the left side. FIG. 11B is a view in the direction of an arrow Y1 in FIG. 11A.

In FIG. 11A, the rotation axis line CL12 of the door portion 11 is so set as to be inclined by the angle θa relative to the base face KM (bottom face BTM) of the control unit 50 in the frontward-rearward direction. The angle θa is the same as an inclination angle of the surrounding face 7a of the dock portion 7.

In this structure, since the rotation axis line CL12 is inclined relative to the vertical direction, a component force of the gravitational force causes a rotational moment for rotating the door portion 11 in the counterclockwise direction in FIG. 11B, thereby rotating the door portion 11 in the direction DR11A in the free state. It is preferable to set the gravity center G in a position as far as possible from the rotation axis line CL12 on a plane which includes the rotation axis line CL12 and which passes through the gravity center G in FIG. 11B since such a setting further enlarges the rotational moment caused by the component force thus allowing a preferable rotation of the door portion 11. For example, it is preferable that the gravity center G of the door portion 11 is set in the vicinity of the peripheral face portion 11C. By this, part of the operation of shifting from the state where the cradle support face 11b is exposed to the state where the cosmetic face 11a is exposed is implemented by an operation of the gravitational force, thus alleviating a load of operation by the user. Further, when a motor is used as a power, a load of the motor can be relieved, thus saving an electric power. As a specific example, a holding unit (a latch device and the like) for holding each of the state of exposing the cradle support face 11b and the state of exposing the cosmetic face 11a is provided for the door rotation portion DK. Then, releasing the retainment of the state in which the exposed cradle support face 11b is held will naturally rotate the door portion 11 with acceleration by a predetermined angle (for example, 90°) to a position in which the rotational moment becomes zero. The door portion 11 may be rotated by a finger for the remaining angle, and may be held by the holding unit in the state in which the cosmetic face 11a is exposed.

What is claimed is:

1. An electronic device comprising: a housing having an open portion at a part of a surface thereof; a door portion having a first face and a second face to be selectively exposed at the open portion by rotation thereof around a predetermined rotation axis line; and a cradle having a connector for connecting a mobile terminal device and provided on the first face; wherein the cradle is configured to be rotatable between a first attitude and a second attitude around a cradle rotation axis line perpendicularly intersecting the first face and wherein the first attitude is an attitude in which the whole cradle is received within the first face, and the second attitude is an attitude in which a part of the cradle extends beyond the first face.

2. The electronic device according to claim 1, wherein the first face is flush or protrudes relative to a face surrounding the open portion.

3. The electronic device according to claim 1, wherein the first face and the second face are set as two cut faces which are obtained by cutting a right circular cylinder around the predetermined rotation axis line by a flat face parallel to the predetermined rotation axis line and which do not intersect with each other.

4. The electronic device according to claim 1, wherein the first face and the second face are the same in width in a direction perpendicularly intersecting the predetermined rotation axis line.

5. The electronic device according to claim 1, wherein the door portion has a lateral cross section formed into a substantially fan-like shape.

6. The electronic device according to claim 1, wherein the first face and the second face are selectively exposed at the open portion such that the second face is not exposed when the first face is exposed and the first face is not exposed when the second face is exposed.

* * * * *